(12) United States Patent
Kamiya

(10) Patent No.: US 6,313,686 B1
(45) Date of Patent: Nov. 6, 2001

(54) WAVEFORM OUTPUT DEVICE WITH EMI NOISE CANCELER MECHANISM

(75) Inventor: Hiroshi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/656,716

(22) Filed: Sep. 7, 2000

(30) Foreign Application Priority Data

Sep. 8, 1999  (JP) .................................................. 11-254138

(51) Int. Cl.$^7$ .................................................. H03K 5/08
(52) U.S. Cl. .......................... 327/312; 327/332; 327/333
(58) Field of Search .................... 326/66, 63, 68, 326/70, 71; 327/333, 312, 332, 433, 328, 108

(56) References Cited

U.S. PATENT DOCUMENTS

| | | | | |
|---|---|---|---|---|
| 5,528,190 | * | 6/1996 | Honnigford | 327/328 |
| 6,052,018 | * | 4/2000 | Watarai | 327/433 |
| 6,175,249 | * | 1/2001 | Goodell | 326/66 |
| 6,204,700 | * | 3/2001 | Seyed | 327/108 |

* cited by examiner

Primary Examiner—Tuan T. Lam
Assistant Examiner—Hiep Nguyen
(74) Attorney, Agent, or Firm—Sughrue, Mion, Zinn, Macpeak & Seas, PLLC

(57) ABSTRACT

When PMOS transistors are successively turned off, the resistance between a PMOS transistor and a power supply VDD is changed, and the amplitude of a waveform at the junction between the last-mentioned PMOS transistor and an NMOS transistor is controlled based on the changed resistance. Thereafter, a waveform output unit outputs a waveform whose harmonic components are made smaller from the junction between the PMOS transistor and the NMOS transistor.

22 Claims, 2 Drawing Sheets

WAVEFORM OUTPUT DEVICE WITH EMI NOISE CANCELER MECHANISM

BACKGROUND OF THE INVENTION

1. Field of the Invention

The present invention relates to a waveform output device with a mechanism for canceling EMI (Electro-Magnetic Interference) noise.

2. Description of the Related Art

When a waveform output device for outputting waveforms produces EMI noise at the time it output a waveform, the EMI noise is radiated to another device positioned near the waveform output device, tending to cause the other device to operate in error.

EMI noise is generated if the outputted waveform has sharp positive-going edges and undergoes overshoot.

Since conventional waveform output devices do not have a mechanism for controlling the overshoot of outputted waveforms and the amplitudes of positive-going edges thereof, the outputted waveforms tend to have greater amplitudes than necessary. As a result, the conventional waveform output devices produce large EMI noise that is radiated to other neighboring devices.

SUMMARY OF THE INVENTION

It is therefore an object of the present invention to provide a waveform output device with an EMI noise canceler mechanism for canceling radiated EMI noise by controlling the amplitudes of waveforms to be outputted thereby.

To achieve the above object, there is provided in accordance with the present invention a waveform output device with an EMI noise canceler mechanism for controlling the amplitude of a waveform to output a waveform from which EMI noise is canceled, comprising a waveform input unit for being supplied with a clock signal waveform, an NMOS transistor having a gate connected to the waveform input unit and a source connected to ground, the NMOS transistor being selectively turned on and off based on a clock signal waveform supplied from the waveform input unit, a first PMOS transistor having a gate connected to the waveform input unit, a drain connected to a power supply through a first resistive component, and a source connected to a drain of the NMOS transistor, the first PMOS transistor being selectively turned on and off based on a clock signal waveform supplied from the waveform input unit, for producing a rising waveform at the source thereof when the first PMOS transistor is turned on, a waveform output unit for outputting a waveform at a junction between the first PMOS transistor and the NMOS transistor, second resistive components in n (n is a natural number) stages each having one terminal connected to the power supply, second PMOS transistors in n stages having respective drains connected to other terminals of the second resistive components, and respective sources connected to the drain of the first PMOS transistor, and a controller having an input terminal connected to the junction between the source of the first PMOS transistor and the drain of the NMOS transistor, and an output terminal connected to respective gates of the second PMOS transistors, for selectively turning on and off the second PMOS transistors based on a waveform at the junction between the source of the first PMOS transistor and the drain of the NMOS transistor, the controller having means for turning off the second PMOS transistors successively from a first stage to change a resistance between the first PMOS transistor and the power supply, the waveform output unit having means for outputting the waveform, whose amplitude has been controlled by the resistance between the first PMOS transistor and the power supply, at the junction between the first PMOS transistor and the NMOS transistor.

The controller comprises differential amplifiers in n stages each having one input terminal for being supplied with the waveform at the junction between the source of the first PMOS transistor and the drain of the NMOS transistor, and another input terminal for being supplied with a comparison potential, for generating and outputting a rising waveform based on a potential of the waveform at the junction between the source of the first PMOS transistor and the drain of the NMOS transistor and the comparison potential, third resistive components in n stages each having one terminal connected to the power supply, and flip-flops in n stages having respective CLK input terminals for being supplied with the respective rising waveforms outputted from the differential amplifiers, respectively, and respective DATA input terminals connected to other terminals of the third resistive components, for generating signals based on the rising waveforms supplied to the CLK input terminals and outputting the generated signals to respective gates of the second PMOS transistors, each of the flip-flops having means for outputting the signal generated based on the rising waveform supplied to the CLK input terminal to an enable terminal of the differential amplifier at a next stage.

The second PMOS transistors and the second resistive components are positionally switched around in a transmission path between the first PMOS transistor and the power supply.

The waveform output devices comprises a fourth resistive component connected to the NMOS transistor.

The waveform output device further comprises a fifth resistive component connected to the first PMOS transistor.

According to the present invention, there is also provided a waveform output device with an EMI noise canceler mechanism for controlling the amplitude of a waveform to output a waveform from which EMI noise is canceled, comprising a waveform input unit for being supplied with a clock signal waveform, an NPN transistor having a base connected to the waveform input unit and an emitter connected to ground, the NPN transistor being selectively turned on and off based on a clock signal waveform supplied from the waveform input unit, a first PNP transistor having a base connected to the waveform input unit, a collector connected to a power supply through a first resistive component, and an emitter connected to a collector of the NPN transistor, the first PNP transistor being selectively turned on and off based on a clock signal waveform supplied from the waveform input unit, for producing a rising waveform at the emitter thereof when the first PNP transistor is turned on, a waveform output unit for outputting a waveform at a junction between the first PNP transistor and the NPN transistor, second resistive components in n (n is a natural number) stages each having one terminal connected to the power supply, second PNP transistors in n stages having respective collectors connected to other terminals of the second resistive components, and respective emitters connected to the collector of the first PNP transistor, and a controller having an input terminal connected to the junction between the emitter of the first PNP transistor and the collector of the NPN transistor, and an output terminal connected to respective bases of the second PNP transistors, for selectively turning on and off the second PNP transistors based on a waveform at the junction between the emitter of the first PNP transistor and the collector of the NPN transistor, the controller having means for turning off the second PNP transistors successively from a first stage to change a resistance between the first PNP transistor and the power supply, the waveform output unit having means for outputting the waveform, whose amplitude has been controlled by the resistance between the first PNP transistor and the power supply, at the junction between the first PNP transistor and the NPN transistor.

The controller comprises differential amplifiers in n stages each having one input terminal for being supplied with the waveform at the junction between the emitter of the first PNP transistor and the collector of the NPN transistor, and another input terminal for being supplied with a comparison potential, for generating and outputting a rising waveform based on a potential of the waveform at the junction between the emitter of the first PNP transistor and the collector of the NPN transistor and the comparison potential, third resistive components in n stages each having one terminal connected to the power supply, and flip-flops in n stages having respective CLK input terminals for being supplied with the respective rising waveforms outputted from the differential amplifiers, respectively, and respective DATA input terminals connected to other terminals of the third resistive components, for generating signals based on the rising waveforms supplied to the CLK input terminals and outputting the generated signals to respective bases of the second PNP transistors, each of the flip-flops having means for outputting the signal generated based on the rising waveform supplied to the CLK input terminal to an enable terminal of the differential amplifier at a next stage.

The second PNP transistors and the second resistive components are positionally switched around in a transmission path between the first PNP transistor and the power supply.

The waveform output device further comprises a fourth resistive component connected to the NPN transistor.

The waveform output device further comprises a fifth resistive component connected to the first PNP transistor.

The comparison potential supplied to each of the differential amplifier is higher than the comparison potential supplied to the differential amplifier in the next stage.

Each of the differential amplifier is supplied with the comparison potential which is generated within the waveform output device.

Each of the differential amplifier is supplied with the comparison potential which is generated outside of the waveform output device.

With the above arrangement, in the controller, the second PMOS transistors in n stages are turned off successively from the first stage to change the resistance between the first PMOS transistor and the power supply, and the amplitude of the waveform at the junction between the first PMOS transistor and the NMOS transistor is controlled on the basis of the changed resistance.

The waveform at the junction between the first PMOS transistor and the NMOS transistor has its overshoot suppressed and its positive-going edge rendered gradual, and contains reduced harmonic components, so that EMI noise can be canceled when the waveform is outputted.

The above and other objects, features, and advantages of the present invention will become apparent from the following description with reference to the accompanying drawings which illustrates an example of the present invention.

DETAIL DESCRIPTION OF THE PREFERRED EMBODIMENT

Figure 1:
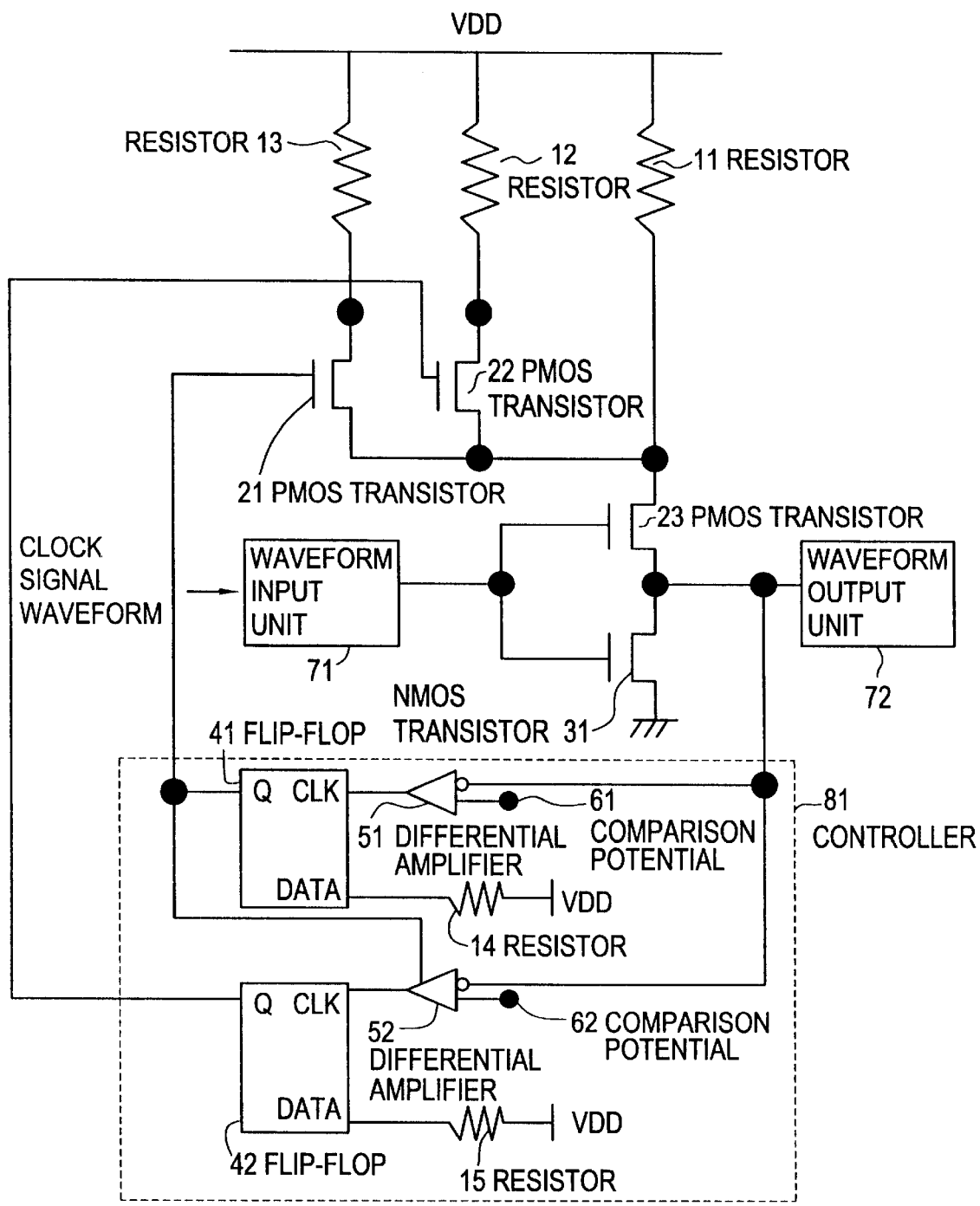
FIG. 1 is a circuit diagram of a waveform output device with an EMI noise canceler mechanism according to the present invention.

FIG. 1 shows a circuit arrangement of a waveform output device with an EMI noise canceler mechanism according to the present invention.

As shown in FIG. 1, the waveform output device comprises waveform input unit 71, resistor 11 as a first resistive component, a pair of resistors 12, 13 as second resistive components, PMOS transistor 23 as a first PMOS transistor, a pair of PMOS transistors 21, 22 as second PMOS transistors, NMOS transistor 31, waveform output unit 71, and controller 81.

Controller 81 comprises a pair of differential amplifiers 51, 52, a pair of flip-flops 41, 42, and a pair of resistors 14, 15 as third resistive components.

Resistor 11 has one terminal connected to a power supply VDD and the other terminal connected to the source of PMOS transistor 21, the source of PMOS transistor 22, and the drain of PMOS transistor 23.

Resistor 12 has one terminal connected to the power supply VDD and the other terminal connected to the drain of PMOS transistor 22.

Resistor 13 has one terminal connected to the power supply VDD and the other terminal connected to the drain of PMOS transistor 21.

Waveform input unit 71 is connected to the gates of PMOS transistor 23 and NMOS transistor 31. When a clock signal is supplied from an external source to waveform input unit 71, the waveform of the clock signal is supplied to PMOS transistor 23 and NMOS transistor 31.

PMOS transistor 23 is turned on or off by the waveform of the clock signal supplied from waveform input unit 71. When PMOS transistor 23 is turned on, a rising waveform appears at the junction between the source of PMOS transistor 23 and the drain of the NMOS transistor 31.

NMOS transistor 31 has its source connected to ground. NMOS transistor 31 is turned on or off by the waveform of the clock signal supplied from waveform input unit 71.

Waveform output unit 72 is connected to the junction between the source of PMOS transistor 23 and the drain of NMOS transistor 31, and outputs the waveform from this junction.

Differential amplifier 51 has one input terminal supplied with the waveform at the junction between the source of PMOS transistor 23 and the drain of NMOS transistor 31 and the other input terminal supplied with a comparison potential 61. The differential amplifier 51 generates a rising waveform based on the potential of the waveform at the junction between the source of PMOS transistor 23 and the drain of NMOS transistor 31 and comparison potential 61, and outputs the generated rising waveform to a CLK input terminal of flip-flop 41.

Differential amplifier 52 has one input terminal supplied with the waveform at the junction between the source of PMOS transistor 23 and the drain of NMOS transistor 31 and the other input terminal supplied with comparison potential 62. Differential amplifier 52 generates a rising waveform based on the potential of the waveform at the junction between the source of PMOS transistor 23 and the drain of NMOS transistor 31 and comparison potential 62, and outputs the generated rising waveform to a CLK input terminal of flip-flop 42.

Comparison potential 61 is higher than comparison potential 62.

Flip-flop 41 has its CLK input terminal connected to the output terminal of differential amplifier 51, a DATA input terminal connected the power supply VDD via resistor 14, and waveform output terminal Q connected to an enable terminal of differential amplifier 52 and the gate of PMOS transistor 21. Based on the rising waveform outputted from differential amplifier 51, flip-flop 41 generates a high-level signal and outputs the generated high-level signal to differential amplifier 52 and PMOS transistor 21.

Flip-flop 41 has its CLK input terminal connected to the output terminal of differential amplifier 52, a DATA input terminal connected the power supply VDD via resistor 15, and waveform output terminal Q connected to the gate of PMOS transistor 22. Based on the rising waveform outputted from differential amplifier 52, flip-flop 42 generates a high-level signal and outputs the generated high-level signal to PMOS transistor 22.

PMOS transistor 21 is turned off in response to the high-level signal outputted from flip-flop 41.

PMOS transistor 22 is turned off in response to the high-level signal outputted from flip-flop 42.

PMOS transistors 21, 22 produce output currents which are identical to each other.

Differential amplifier 52 is turned on in response to the high-level signal outputted from flip-flop 41.

Operation of the waveform output device with the EMI noise canceler mechanism which is constructed as described above will be described below.

In an initial state of the waveform output device, the waveform output terminals Q of flip-flops 41, 42 are clamped to a low level, PMOS transistors 21, 22 are turned on, and the output terminal of differential amplifier 51 is disabled.

When a clock signal waveform is supplied to waveform input unit 71 in the initial state, the clock signal waveform is applied from waveform input unit 71 to PMOS transistor 23 and NMOS transistor 31. PMOS transistor 23 is turned on or off based on the applied clock signal waveform. When PMOS transistor 23 is turned on, a rising waveform appears at the junction between the source of PMOS transistor 23 and the drain of NMOS transistor 31.

At this time, both the PMOS transistors 21, 22 are turned on because they are in the initial state.

If each of resistance R11 of resistor 11, resistance R12 of resistor 12, and resistance R13 of resistor 13 is represented by R, then the resistance between the drain of PMOS transistor 23 and the power supply VDD is represented by R/3.

If the transmission path connected between the junction between PMOS transistor 23 and NMOS transistor 31 and waveform output unit 72 has a high characteristic impedance, then the waveform appearing at the junction between the source of PMOS transistor 23 and the drain of NMOS transistor 31 has a sharp positive-going edge.

Figure 2:
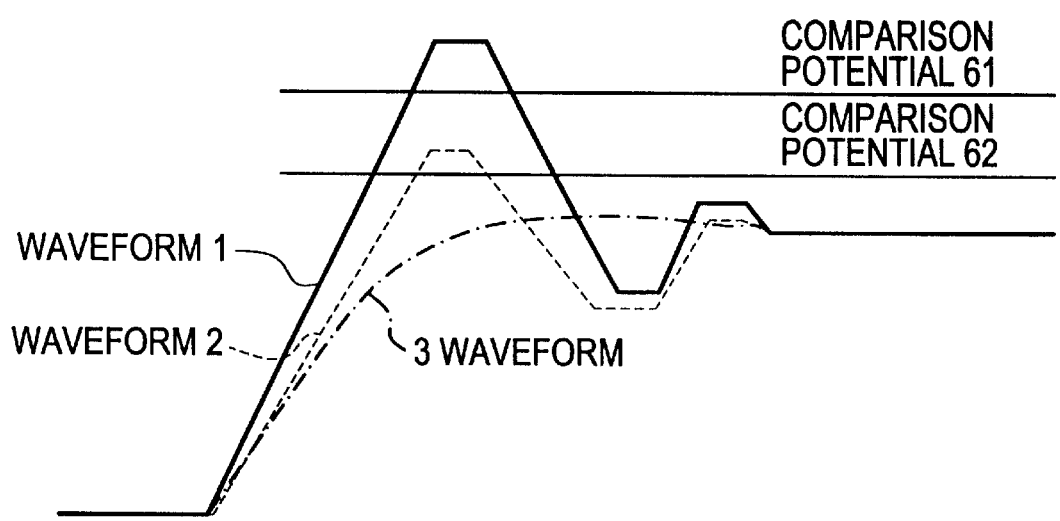
FIG. 2 is a diagram showing the waveforms of signals at the junction between the source of a first PMOS transistor and the drain of an NMOS transistor in the waveform output device shown in FIG. 1.

FIG. 2 shows waveforms produced at the junction between the source of PMOS transistor 23 and the drain of NMOS transistor 31 when PMOS transistor 23 is turned on. FIG. 2 also shows the relationship between the potentials of the waveforms and comparison potentials 61, 62. As shown in FIG. 2, comparison potential 61 is set to a level higher than comparison potential 62.

As shown in FIG. 2, if the resistance between the drain of PMOS transistor 23 and power supply VDD is R/3, then the waveform produced at the junction between the source of PMOS transistor 23 and the drain of NMOS transistor 31 is represented by waveform 1 having a sharp positive-going edge. Since waveform 1 contains large harmonic components, it produces large EMI noise.

At this time, because the potential of waveform 1 at the junction between the source of PMOS transistor 23 and the drain of NMOS transistor 31 is higher than comparison potential 61, differential amplifier 51 generates a rising waveform, which is outputted to CLK input terminal of flip-flop 41.

When a CLK edge of the rising waveform outputted from the differential amplifier 51 is applied to the CLK input terminal of the flip-flop 41, the flip-flop 41 generates a high-level signal, which is outputted to the gate of the PMOS terminal 21 and the enable terminal of the differential amplifier 52. Therefore, the PMOS transistor 21 is turned off, and the differential amplifier 52 is turned on.

Consequently, when the clock signal waveform is being supplied to waveform input unit 71, PMOS transistor 21 is turned off, and PMOS transistor 22 remains turned on. Therefore, the resistance between the drain of PMOS transistor 23 and power supply VDD is represented by R/2.

When PMOS transistor 23 is turned on based on the clock signal waveform applied from waveform input unit 71, a rising waveform appears at the junction between the source of PMOS transistor 23 and the drain of NMOS transistor 31.

Since the resistance between the drain of PMOS transistor 23 and power supply VDD is R/2, the waveform at the junction between the source of PMOS transistor 23 and the drain of NMOS transistor 31 is represented by waveform 2 shown in FIG. 2 due to the characteristic impedance of the transmission path connected between the junction between the PMOS transistor 23 and the NMOS transistor 31 and the waveform output unit 72.

At this time, inasmuch as the potential of waveform 2 at the junction between the source of PMOS transistor 23 and the drain of NMOS transistor 31 is lower than comparison potential 61, differential amplifier 51 generates no rising waveform.

However, because the potential of waveform 1 at the junction between the source of PMOS transistor 23 and the drain of NMOS transistor 31 is higher than comparison potential 62, differential amplifier 52 generates a rising waveform, which is outputted to the CLK input terminal of flip-flop 42.

When a CLK edge of the rising waveform outputted from differential amplifier 52 is applied to the CLK input terminal of flip-flop 42, flip-flop 42 generates a high-level signal, which is outputted to the gate of PMOS terminal 22. Therefore, PMOS transistor 22 is turned off.

Consequently, when the clock signal waveform is being supplied to waveform input unit 71, PMOS transistors 21, 22 are turned off. Therefore, the resistance between the drain of PMOS transistor 23 and power supply VDD is represented by R.

When PMOS transistor 23 is turned on based on the clock signal waveform applied from waveform input unit 71, a rising waveform appears at the junction between the source of PMOS transistor 23 and the drain of NMOS transistor 31.

Since the resistance between the drain of PMOS transistor 23 and power supply VDD is R, the waveform at the junction between the source of PMOS transistor 23 and the drain of NMOS transistor 31 is represented by waveform 3 shown in FIG. 2 due to the characteristic impedance of the transmission path connected between the junction between PMOS transistor 23 and NMOS transistor 31 and waveform output unit 72. Waveform 3 has a gradual positive-going edge and contains small harmonic components.

Thereafter, waveform output unit 72 outputs waveform 3 from the junction between the source of PMOS transistor 23 and the drain of NMOS transistor 31. Since waveform 3 has a gradual positive-going edge and contains small harmonic components, it does not produce undue EMI noise.

When the waveform at the junction between the source of PMOS transistor 23 and the drain of NMOS transistor 31 contains large harmonic components, such as when the waveform is represented by waveform 1 or waveform 2, waveform output unit 72 does not output the waveform. Rather, waveform output unit 72 outputs the waveform at the junction between the source of PMOS transistor 23 and the drain of NMOS transistor 31 when it contains small harmonic components, such as when the waveform is represented by waveform 3.

Therefore, the waveform output device according to the present invention can cancel EMI noise by optimally controlling the amplitude of the outputted waveform.

According to the present invention, another flip-flop and another differential amplifier may be added to the circuit arrangement shown in FIG. 1. Such additional circuits require a corresponding PMOS transistor and a corresponding resistor to be combined therewith.

In the illustrated embodiment, PMOS transistors 21, 22 are connected to power supply VDD through respective resistors 13, 12. However, the positions of PMOS transistor 21 and resistor 13 and the positions of PMOS transistor 22 and resistor 12 may be switched around.

In the illustrated embodiment, it is assumed that each of the resistances R11–R13 of resistors 11–13 is of the same value R. However, the resistances R11–R13 may be different from each other.

In the illustrated embodiment, PMOS transistors 21, 22 produce output currents which are identical to each other. However, PMOS transistors 21, 22 may produce different output currents, and may be successively turned off either in the descending order of the output currents or in the ascending order of the output currents.

In the illustrated embodiment, each of the transistors comprises a MOS transistor. However, each of the PMOS transistors may be replaced with a PNP transistor, and each of the NMOS transistors may be replaced with an NPN transistor.

The comparison potentials may be supplied to the differential amplifiers from within or outside of the waveform output device. If the comparison potentials are to be supplied to the differential amplifiers from within the waveform output device, then a circuit for generating the comparison potentials may be disposed in the waveform output device, and the comparison potentials generated by the circuit may be supplied to the differential amplifiers, or potentials corresponding to the comparison potentials may be fed back from far-end components in transmission paths in the waveform output device to the differential amplifiers.

Alternatively, a resistor may be connected to NMOS transistor 31 for controlling the amplitude of the waveform.

Further alternatively, resistors may be connected respectively to PMOS transistor 23 and NMOS transistor 31 for controlling the amplitude of the waveform.

According to the present invention, as described above, in the controller, the second PMOS transistors in n stages are turned off successively from the first stage to change the resistance between the first PMOS transistor and the power supply, and the amplitude of the waveform at the junction between the first PMOS transistor and the NMOS transistor is controlled on the basis of the changed resistance.

The waveform at the junction between the first PMOS transistor and the NMOS transistor has its overshoot suppressed and its positive-going edge rendered gradual, and contains reduced harmonic components, so that EMI noise can be canceled when the waveform is outputted.

While a preferred embodiment of the present invention has been described using specific terms, such description is for illustrative purposes only, and it is to be understood that changes and variations may be made without departing from the spirit or scope of the following claims.

What is claimed is:

1. A waveform output device with an EMI noise canceler mechanism for controlling an amplitude of a waveform to output a waveform from which EMI noise is canceled, comprising:

a waveform input unit for being supplied with a clock signal waveform;

an NMOS transistor having a gate connected to said waveform input unit and a source connected to ground, said NMOS transistor being selectively turned on and off based on a clock signal waveform supplied from said waveform input unit;

a first PMOS transistor having a gate connected to said waveform input unit, a drain connected to a power supply through a first resistive component, and a source connected to a drain of said NMOS transistor, said first PMOS transistor being selectively turned on and off based on a clock signal waveform supplied from said waveform input unit, for producing a rising waveform at the source thereof when the first PMOS transistor is turned on;

a waveform output unit for outputting a waveform at a junction between said first PMOS transistor and said NMOS transistor;

second resistive components in n (n is a natural number) stages each having one terminal connected to said power supply;

second PMOS transistors in n stages having respective drains connected to other terminals of said second resistive components, and respective sources connected to the drain of said first PMOS transistor; and a controller having an input terminal connected to the junction between the source of said first PMOS transistor and the drain of said NMOS transistor, and an output terminal connected to respective gates of said second PMOS transistors, for selectively turning on and off said second PMOS transistors based on a waveform at the junction between the source of said first PMOS transistor and the drain of said NMOS transistor;

said controller having means for turning off said second PMOS transistors successively from a first stage to change a resistance between said first PMOS transistor and said power supply;

said waveform output unit having means for outputting the waveform, whose amplitude has been controlled by the resistance between said first PMOS transistor and said power supply, at the junction between said first PMOS transistor and said NMOS transistor.

2. A waveform output device according to claim 1, wherein said controller comprises:

differential amplifiers in n stages each having one input terminal for being supplied with the waveform at the junction between the source of said first PMOS transistor and the drain of said NMOS transistor, and another input terminal for being supplied with a comparison potential, for generating and outputting a rising waveform based on a potential of the waveform at the junction between the source of said first PMOS transistor and the drain of said NMOS transistor and said comparison potential;

third resistive components in n stages each having one terminal connected to said power supply; and flip-flops in n stages having respective CLK input terminals for being supplied with the respective rising waveforms outputted from said differential amplifiers, respectively, and respective DATA input terminals connected to other terminals of said third resistive components, for generating signals based on the rising waveforms supplied to said CLK input terminals and outputting the generated signals to respective gates of said second PMOS transistors;

each of said flip-flops having means for outputting the signal generated based on the rising waveform supplied to said CLK input terminal to an enable terminal of the differential amplifier at a next stage.

3. A waveform output device according to claim 1, wherein said second PMOS transistors and said second resistive components are positionally switched around in a transmission path between said first PMOS transistor and said power supply.

4. A waveform output device according to claim 2, wherein said second PMOS transistors and said second resistive components are positionally switched around in a transmission path between said first PMOS transistor and said power supply.

5. A waveform output device according to claim 1, further comprising a fourth resistive component connected to said NMOS transistor.

6. A waveform output device according to claim 2, further comprising a fourth resistive component connected to said NMOS transistor.

7. A waveform output device according to claim 1, further comprising a fifth resistive component connected to said first PMOS transistor.

8. A waveform output device according to claim 2, further comprising a fifth resistive component connected to said first PMOS transistor.

9. A waveform output device with an EMI noise canceler mechanism for controlling an amplitude of a waveform to output a waveform from which EMI noise is canceled, comprising:

a waveform input unit for being supplied with a clock signal waveform;

an NPN transistor having a base connected to said waveform input unit and an emitter connected to ground, said NPN transistor being selectively turned on and off based on a clock signal waveform supplied from said waveform input unit;

a first PNP transistor having a base connected to said waveform input unit, a collector connected to a power supply through a first resistive component, and an emitter connected to a collector of said NPN transistor, said first PNP transistor being selectively turned on and off based on a clock signal waveform supplied from said waveform input unit, for producing a rising waveform at the emitter thereof when the first PNP transistor is turned on;

a waveform output unit for outputting a waveform at a junction between said first PNP transistor and said NPN transistor;

second resistive components in n (n is a natural number) stages each having one terminal connected to said power supply;

second PNP transistors in n stages having respective collectors connected to other terminals of said second resistive components, and respective emitters connected to the collector of said first PNP transistor; and a controller having an input terminal connected to the junction between the emitter of said first PNP transistor and the collector of said NPN transistor, and an output terminal connected to respective bases of said second PNP transistors, for selectively turning on and off said second PNP transistors based on a waveform at the junction between the emitter of said first PNP transistor and the collector of said NPN transistor;

said controller having means for turning off said second PNP transistors successively from a first stage to change a resistance between said first PNP transistor and said power supply;

said waveform output unit having means for outputting the waveform, whose amplitude has been controlled by the resistance between said first PNP transistor and said power supply, at the junction between said first PNP transistor and said NPN transistor.

10. A waveform output device according to claim 9, wherein said controller comprises:

differential amplifiers in n stages each having one input terminal for being supplied with the waveform at the junction between the emitter of said first PNP transistor and the collector of said NPN transistor, and another input terminal for being supplied with a comparison potential, for generating and outputting a rising waveform based on a potential of the waveform at the junction between the emitter of said first PNP transistor and the collector of said NPN transistor and said comparison potential;

third resistive components in n stages each having one terminal connected to said power supply; and flip-flops in n stages having respective CLK input terminals for being supplied with the respective rising waveforms outputted from said differential amplifiers, respectively, and respective DATA input terminals connected to other terminals of said third resistive components, for generating signals based on the rising waveforms supplied to said CLK input terminals and outputting the generated signals to respective bases of said second PNP transistors;

each of said flip-flops having means for outputting the signal generated based on the rising waveform supplied to said CLK input terminal to an enable terminal of the differential amplifier at a next stage.

11. A waveform output device according to claim 9, wherein said second PNP transistors and said second resistive components are positionally switched around in a transmission path between said first PNP transistor and said power supply.

12. A waveform output device according to claim 10, wherein said second PNP transistors and said second resistive components are positionally switched around in a transmission path between said first PNP transistor and said power supply.

13. A waveform output device according to claim 9, further comprising a fourth resistive component connected to said NPN transistor.

14. A waveform output device according to claim 10, further comprising a fourth resistive component connected to said NPN transistor.

15. A waveform output device according to claim 9, further comprising a fifth resistive component connected to said first PNP transistor.

16. A waveform output device according to claim 10, further comprising a fifth resistive component connected to said first PNP transistor.

17. A waveform output device according to claim 2, wherein the comparison potential supplied to each of said differential amplifier is higher than the comparison potential supplied to the differential amplifier in the next stage.

18. A waveform output device according to claim 10, wherein the comparison potential supplied to each of said differential amplifier is higher than the comparison potential supplied to the differential amplifier in the next stage.

19. A waveform output device according to claim 2, wherein each of said differential amplifier is supplied with the comparison potential which is generated within the waveform output device.

20. A waveform output device according to claim 10, wherein each of said differential amplifier is supplied with the comparison potential which is generated within the waveform output device.

21. A waveform output device according to claim 2, wherein each of said differential amplifier is supplied with the comparison potential which is generated outside of the waveform output device.

22. A waveform output device according to claim 10, wherein each of said differential amplifier is supplied with the comparison potential which is generated outside of the waveform output device.

* * * * *